United States Patent [19]
Hopkins

[11] 3,946,287
[45] Mar. 23, 1976

[54] SOLENOID OPERATED FLUID VALVES

[75] Inventor: Charles L. Hopkins, Cincinnati, Ohio

[73] Assignee: The Globe Tool and Engineering Company, Dayton, Ohio

[22] Filed: Feb. 25, 1974

[21] Appl. No.: 445,772

[52] U.S. Cl............. 317/148.5 R; 251/131; 251/137
[51] Int. Cl.² ........................................ H01H 47/32
[58] Field of Search .......... 317/123, 136, 137, 140, 317/148.5 R, 148.5 B, 155.5, 141 S, DIG. 9, DIG. 3, 157; 251/137, 129, 131; 137/596.16, 596.17, 625.64, 625.65; 307/235, 241, 242; 328/147, 153

[56] References Cited
UNITED STATES PATENTS

| | | | |
|---|---|---|---|
| 2,599,862 | 6/1952 | Ray | 317/DIG. 3 |
| 3,243,665 | 3/1966 | Fayer et al. | 317/137 |
| 3,365,624 | 1/1968 | Komendera | 317/141 S |
| 3,378,732 | 4/1968 | Dietz et al. | 317/123 |
| 3,638,074 | 1/1972 | Inouye | 317/148.5 R |
| 3,709,253 | 1/1973 | Spangenberg | 251/129 |

OTHER PUBLICATIONS

"To–5 Relays Offer Considerable Space Saving With High Reliability" Electronic Engineering 2/71 pp. 60–63.

*Primary Examiner*—J D Miller
*Assistant Examiner*—Harry E. Moose, Jr.
*Attorney, Agent, or Firm*—Dybvig & Dybvig

[57] ABSTRACT

By incorporating driver switching circuitry and a suppression network as parts fixed with respect to a valve housing rather than remotely from the valve housing, advantages including transient suppression at the housing are obtained rendering the valve better suited for low power machine control operation. Both AC and DC operated valves with driver switching circuits and suppression networks are disclosed.

15 Claims, 6 Drawing Figures

3,946,287

SOLENOID OPERATED FLUID VALVES

BACKGROUND OF THE INVENTION

This invention relates to solenoid operated fluid valves and more particularly to electronic circuitry for controlling the operation of such valves.

Commercially available single-acting, solenoid operated valves normally have two external circuit connections for each coil including a source or positive connection and a ground connection. In a double-acting valve there are normally two solenoid coils with appropriate connections provided.

Production machines frequently utilize several such valves. For example, in double flier armature winding machines there may be on the order of 15-20 solenoid operated fluid valves. Conventionally the valves are remote from the circuitry which controls the energization of the valves.

Increased reliability, ease of maintenance and economies of manufacture are among benefits that can be obtained by converting the more conventional control circuits for machines such as automatic armature winding machines to circuits utilizing solid state components including integrated circuit control logic. To minimize the power required to operate such machines it is desirable that the valve controls or the like be operated at minimal power levels. However, noise resulting from the operation of the various components of the machine and especially the voltage spikes created upon collapse of the solenoid coils, if transmitted from the valves to the control circuit elements, may cause ill-timed or unwanted operation of one or more of the valves.

Another problem experienced primarily with AC operated double-acting valves is that both coils within the valve housing may be inadvertently simultaneously energized. As a result the coils of such valves are often burned out.

The primary object of this invention is to provide an improved solenoid operated fluid valve especially adapted for use with solid state control systems in production machinery or the like wherein a number of such valves are used. The following patents are considered to be reasonably representative of the prior art relating to such valves:

| | |
|---|---|
| 3,790,127 | 3,709,253 |
| 3,659,631 | 3,580,504 |
| 2,599,862 | 2,759,429 |

SUMMARY OF THE INVENTION

In accordance with this invention a transient suppression network and driver switching circuitry are fixed relative to the housing of each valve. Preferably the circuitry is mounted on the valve housing so that the valve may be made available as a commercial product which can be connected with minimal connection to an external voltage source and external control logic. In perhaps its simplest form a DC operated solenoid having only a single coil located in the valve housing will be connected in series to a switching transistor also located in the housing and a transient suppression diode would be placed in parallel with either the solenoid coil or the transistor. If the transistor is grounded to the housing the only external connections needed would be the voltage source connection and a connection for coupling the base of the transistor to the control logic.

A preferred embodiment of a double-acting DC operated solenoid valve further includes a selector network, also fixed to the valve housing, to insure that only one solenoid coil could be switched on at any given point in time. A simple selector network for DC operation could include two transistors connected in mutually parallel relation, one each being in series relation between the aforementioned switching transistor and one solenoid coil and the other being connected in series relation between the same switching transistor and the other solenoid coil, and an inverter circuit connecting the bases of the last mentioned transistors.

The same concept can be utilized in AC operated solenoid valves which in its simplest form could incorporate a triac or other thyristor in series relation to the solenoid coil and an RC transient suppression network. However, in a valve having two solenoid coils, to insure that both solenoids will not be operated at the same time, a selector network is preferably provided within the valve housing. The selector network circuitry may include AND gates operative to control the thyristor gating current and an inverter between the AND gates. The AC circuit preferably also includes other circuit components fixed relative to the valve housing for switching or enabling operation of the selected solenoid, the circuitry within the valve housing being designed to produce minimal noise as well as suppress external noise that may enter the circuit.

BRIEF DESCRIPTION OF THE DRAWINGS

FIG. 1 is a diagram of solenoid operated fluid valves and control circuitry for use therewith in a production machine or the like.

DESCRIPTION OF THE PREFERRED EMBODIMENTS

Figure 1:
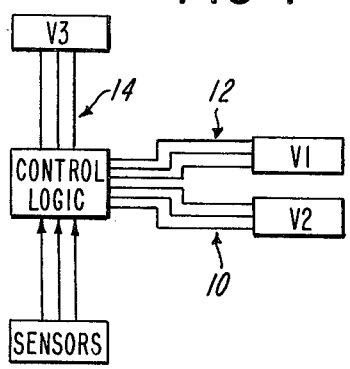

With reference to FIG. 1, three double acting solenoid operated valves designated $V_1$, $V_2$ and $V_3$ are shown connected by circuits 10, 12 and 14 to the machine control logic which preferably would be low power integrated circuit logic. The logic is controlled in part by sensors which sense the operation of various devices including those devices that are controlled by valves such as the valves $V_1$, $V_2$ and $V_3$. In a typical production machine there may be ten to thirty or more such valves. Because of the well known voltage spikes resulting from collapse of the fields around the solenoid coils within the valve housings, there normally is considerable electrical noise or spurious signals within the circuitry such as 10, 12 and 14. Such voltage spikes are normally at levels vastly greater than the signals which would be generated by the control logic to operate the valves. It is not at all uncommon, especially when using devices which are operated by relatively low power level signals, for the noise level to be so high that the spurious signals generated as a result of mutual inductance of, say, the circuits 10 and 12 would cause accidental energization or de-energization of one or more valves.

Figure 2:
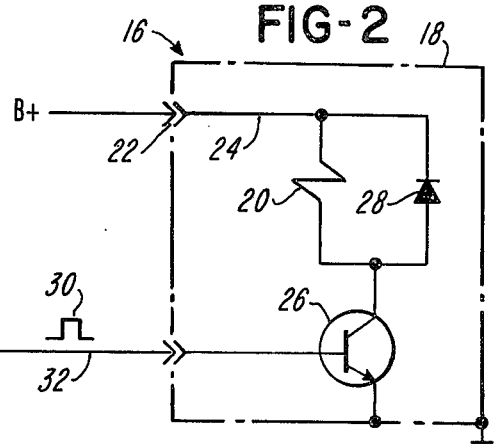
FIG. 2 is a diagrammatic view of a single-acting DC operated solenoid valve in accordance with this invention.

FIG. 2 illustrates a valve generally designated 16 made in accordance with this invention constructed to create minimal noise in the circuitry between the valve and the control logic. The valve 16 includes a housing 18 for the valve operating solenoid 20. A source of positive DC voltage, designated B+, is connected to the housing through any suitable connector 22 at or on the housing which in turn is connected by a line 24 to one side of the solenoid 20. The other side of the solenoid 20 is connected in series relation to the collector of a transistor 26. The emitter of the transistor 26 is connected to ground. The ground connection can be made through another line (not shown) to a connector at the housing 18 or preferably, and as illustrated, is ground connected to the housing 18 which, in use, would be mounted on and grounded to the machine bed. A suppression network is also provided consisting in this case simply of a diode 28 connected across the solenoid 20.

The operation of the valve 16 is apparent upon inspection. As indicated by the waveform 30 in the external conductor or line 32 from the control logic, a simple low level pulse just sufficient to render the collector and emitter electrodes of the transistor 26 conductive by biasing its control electrode or base positive is all that is needed to energize the solenoid 20. The line 32 would typically be connected to ground at the control logic except when the low level pulse is generated. Therefore the line 32 is a low impedance line which will be relatively unaffected by noise. That is, little ringing will be experienced in line 32. Experiments establish that solenoids 20 which can be operated from a 12 volt battery source will in the absence of the diode 28 produce voltage spikes on the order of 400 volts. Using a diode to suppress the spikes or transients, the momentary voltage increase resulting from de-energization of the solenoid 20 will be on the order of one volt. It is thus seen that with the circuitry including the diode 28 and the transistor 26 fixed to the valve housing 18 makes it possible to connect the control for the solenoid 20 to the control logic with low impedance, substantially noise free lines. The voltage spikes or transients that otherwise could deleteriously effect the control logic as well as adjacent circuit connections to other valves are for all practical purposes isolated within the valve housing 18.

Here it may be noted that the valve 16 may be of the type illustrated wherein the pulse illustrated by the waveform 30 is all that is required to energize the solenoid. Alternatively the valve 16 may be of the type wherein a conduction through the solenoid 20 need be maintained over a relatively long period of time in which event a constant positive DC potential may be applied to the base of the transistor 26 by the control logic.

Figure 3:
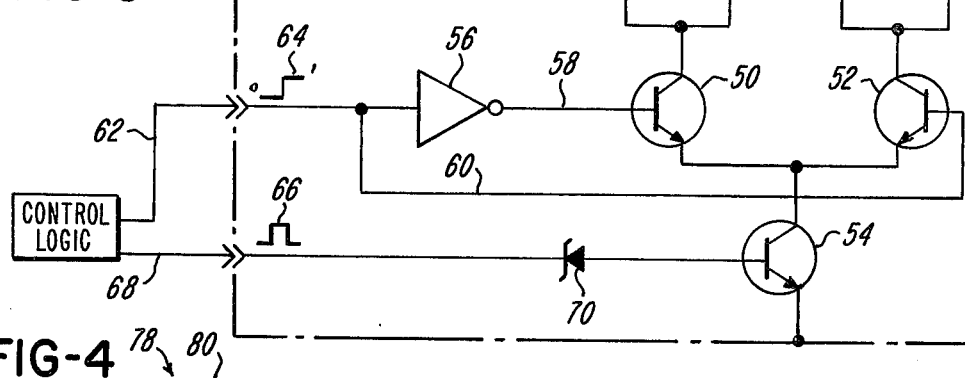
FIG. 3 is a preferred embodiment of a double-acting DC operated solenoid valve in accordance with this invention.

In FIG. 3 is illustrated a double-acting valve 38 having a housing 40 encasing a first valve controlling solenoid 42 and a second valve controlling solenoid 44, having, across each, a suppressor network consisting respectively of diodes 46 and 48. The circuitry within the valve housing 40 of FIG. 3 further includes a selector network comprising a first transistor 50 in series with the solenoid 42 and a second transistor 52 in series with the solenoid 44. The emitter terminals of the transistors 50 and 52 are at a common point connected to an enabling or switching transistor 54, the emitter of which is grounded to the housing 40. The selector network further includes an inverter 56, one end of which is connected by a conductor 58 to the base of the transistor 50 and the other end of which is connected by a conductor 60 to the base of the transistor 52. The selector network is controlled from the control logic through an external conductor 62. As indicated by the waveform 64, the control logic maintains the conductor 62 at one of two logic levels at all times, these being represented by a "0" logic level and a "1" logic level. Those familiar with the art will readily appreciate that one of the transistors 50,52 will be biased to a conductive state at one of the logic levels and the other of the transistors 50,52 biased to a conductive state at the other of the logic levels. When one of the transistors 50,52 is biased to a conductive state, the other is biased to a non-conductive state. Thus the selector network comprising the transistors 50 and 52, the inverter 56 and the conductors connecting the bases of the transistors 50 and 52 in series with the inverter 56 functions to preclude accidental simultaneous operation of both solenoids 42 and 44. Further it permits the control logic to operate in such fashion as to preselect the desired solenoid 42 or 44 which is to be energized when the switching transistor 54 receives a pulse, the character of which is indicated by the waveform 66, from the control logic along the external enabling or switching conductor 68. Optionally a Zener diode 70 may be placed within the housing 40 in series with the base of the transistor 54 to prevent accidental operation of the transistor 54 by noise at levels lower than represented by the pulse waveform 66.

It will be observed that the external circuit connections 62 and 68 between the valve housing 40 and the control logic are low impedance conductors which, because of the low voltage drop across them would not create any significant noise to adversely effect the operation of the machine components. Also due to their low impedance, the conductors 62 and 68 would be relatively noise resistant.

Figure 4:
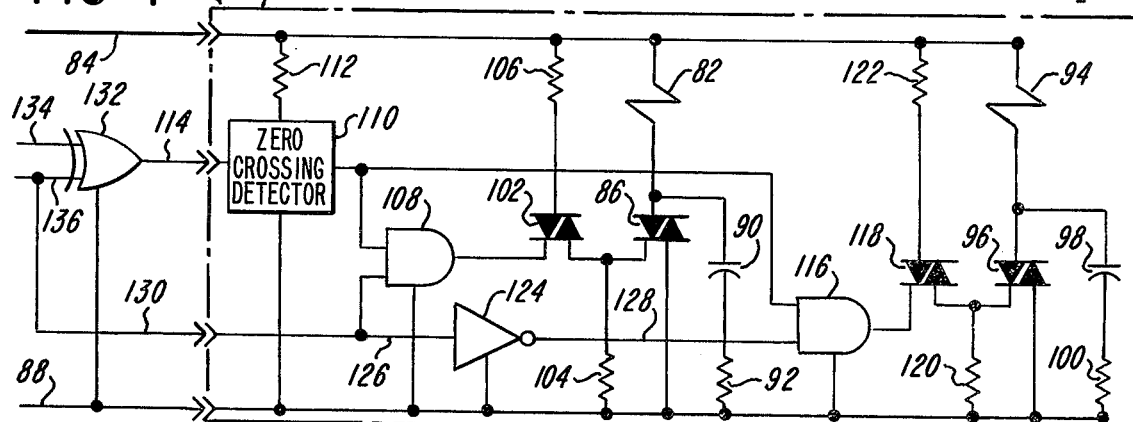
FIG. 4 is a preferred form of an AC operated double-acting solenoid fluid valve made in accordance with this invention.

FIG. 4 illustrates a valve 78 which is a double-acting AC solenoid operated valve provided with circuitry fixed relative to the valve housing 80 that is roughly equivalent to the DC circuitry of FIG. 3. The valve 78 includes a first AC solenoid 82 connected to a source line 84. The solenoid 82 is energized when a triac 86 is gated to become conductive, one main terminal electrode of the triad 86 being connected to the solenoid 82 and the other main terminal electrode being connected to a source return line 88. To prevent accidental triggering of the triac 86, a thyrector (not shown) or similar device may be included in or near the housing 80 across the source line 84 and the source return 88. Transients created by collapse of the field around the coil 82 when the triac 86 is rendered non-conductive are suppressed by a conventional suppressor network including a capacitor 90 and a resistor 92 in parallel with the triac 86.

The second solenoid, designated 94, within the housing 80 is similarly energized when a triac 96 is rendered conductive. Transients created upon de-energization of the solenoid 94 are suppressed by a suppressor network having a capacitor 98 and a resistor 100.

As those familiar with triacs are aware, a triac gated to a positive or conducting state will tend to become non-conductive during the interval of each cycle that the current passing through it approaches zero. The circuit of FIG. 4 is designed to avoid the noise which might be produced from such condition. Thus triac 86 is a slave to a pilot triac 102, one main terminal electrode of which is connected to the control electrode or gate of the triac 86 to supply sufficient gate current to maintain the triac 86 conductive. These connected terminals are isolated from the return by a resistor 104. The other main terminal electrode of the triac 102 is connected by a resistor 106 to the AC source conductor 84. The gate current of the pilot triac 102 is controlled by the output of an AND gate 108 having an input fed by a zero-crossing detector 110 connected by a resistor 112 to the AC line. The output of the zero-crossing detector could be directly connected to the gate of the pilot triac 102. The AND gate 108 is interposed in the circuit of FIG. 4 as part of the selector circuit for selecting which of the solenoids 82 and 94 will be energized at any given time, as will be more fully described below.

The zero-crossing detector 110 and the pilot triac 102 are part of the switching circuit fixed relative to the valve housing 80. The detector 110 is connected to external control logic by an external conductor 114. The output of the zero-crossing detector is also connected to the input of a second AND gate 116, the output of which controls the gate of a second pilot triac 118 having a main terminal connected to the gate of the triac 96 which is used to control the solenoid 94. The interconnected main terminal of the triac 118 and the gate of the triac 96 are isolated from the return 88 by a resistor 120. The other main terminal of the triac 118 is connected by a resistor 122 to the AC source line 84.

It will be noted that the corresponding inputs to both AND gates 108 and 116 are at equipotential points. Accordingly when the zero-crossing detector 110 is energized by a signal received through external conductor 114 from the external machine control logic, the appropriate signal will be received at the corresponding inputs of gates 108 and 116 tending to render the pilot triacs 102 and 118 and accordingly the slave triacs 86 and 96 conductive. Thus energization of the zero-crossing detector 110 tends to switch on both solenoids 82 and 94.

Selection of the desired solenoid, whether it be solenoid 82 or solenoid 94, to be energized at a given instant in time is determined by a selector network comprising an inverter 124, one end of which is connected by a conductor 126 to the second input of the AND gate 108 and the other end of which is connected by a conductor 128 to the second input of the AND gate 116. The conductor 126 is connected to the machine control logic by an external conductor 130. As apparent, a signal received through external conductor 130 tending to render the AND gate 108 conductive will, because of the inverter 124, prevent conduction through the AND gate 116. The opposite is also true; i.e., when AND gate 116 becomes conductive, AND gate 108 cannot conduct.

FIG. 4 illustrates part of the machine control logic which is external from the valve housing 80. This includes an Exclusive OR gate 132. First and second triggering conductors 134 and 136, respectively, are connected to the input of the OR gate 132. At its input to the OR gate 132, the second triggering conductor 136 is common with the external conductor 130 connected to the inverter 124. When a signal of the nature required to cause conduction of the triac 86 and thus energization of the solenoid 82 appears along the triggering conductor 136, and there is no corresponding signal in the triggering conductor 134, the zero-crossing detector 110 will be energized. At the same time, the signal in the triggering conductor 136 will be carried along the external selector conductor 130 to its input to the AND gate 108. Accordingly, the AND gate 108 becomes conductive, the triac 86 becomes conductive, and the solenoid 82 is energized. At the same time the potential at the input to the AND gate 116 of the conductor 128 is at a zero or base level whereupon the AND gate 116 cannot conduct. Therefore, the solenoid 94 is not energized. If the signal along the triggering conductor 136 is at the base level, the AND gate 108 cannot conduct but the input of the conductor 128 to the AND gate 116, due to the operation of the inverter 124, will cause conduction of the AND gate 116 when a suitable signal appears in the first triggering conductor 134.

Thus it is seen in FIG. 4 that, in addition to the source conductor 84 and the source return conductor 88, the valve 78 constructed in accordance with this invention need have only the two low impedance conductors 114 and 130 connected to the machine control logic. The conductor 130 may be considered as a selector conductor since the signals carried by it will determine which one of the AND gates 108 or 116 can become conductive. External conductor 114 may be considered to be a switching or enabling conductor since any sufficient signal occuring thereon will cause one of the AND gates to become conductive.

If miniaturized state-of-the-art components are used the circuitry described above with relation to any of the Figures 2, 3 and 4 can readily be mounted in fixed relation to its valve housing in any of a variety of ways. To provide the circuitry of FIG. 2, the diode 28 and the transistor 26 could be separately mounted upon a printed circuit board affixed to or within the valve housing. Alternatively two transistors, one of them having its base and collector shorted to form the diode 28, could be encased within the housing. A convenient construction to affix the circuit components of FIG. 3 relative to the housing 40 would be to use a dual in-line plug (not shown) having an array of six transistors. Three of the transistors would correspond to transistors 50, 52 and 54. Two of them would have their base and collector shorted to form the diodes 46 and 48. The sixth transistor could be used with a resistor (not shown) to form the inverter 56. The dual in-line package could be associated optionally with another transistor having its collector and emitter shorted to form the Zener 70.

The circuitry of FIG. 4 would unquestionably be bulkier to incorporate in fixed relation to the valve housing 80 than is the case of the embodiments shown in FIGS. 2 and 3. Again, however, using miniaturized components the entire circuitry as shown within housing 80 in FIG. 4 could be cased within or directly upon the housing and require little or no additional space.

Figure 5:
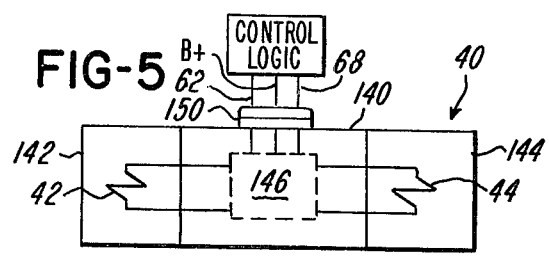
FIG. 5 illustrates the manner in which a solenoid operated valve with the circuitry of FIG. 3 may be fixed relative to the valve housing and external circuit connections conveniently made.

As an example of a packaging configuration, FIG. 5 illustrates the valve housing 40 which consists of a main valve housing portion 140 and end housing portions 142 and 144 for the solenoids 42 and 44, respectively.

Mounted within or within the main valve housing 140 is a printed circuit board 146. The operation of the valve 40 is controlled from the control logic through a three conductor cable attached by a connector 150 to the main housing portion 140. The three conductors extending from the control logic to the connector 150 are the B+ conductor, the selector conductor 62, and the switching or enabling conductor 68. The components mounted on the printed circuit board 146 are not shown, these being the elements 46, 48, 50, 52, 54, 56 and 70 shown in FIG. 3.

Figure 6:
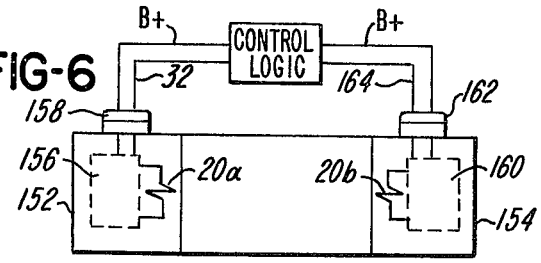
FIG. 6 is a view similar to FIG. 5 but embodying modifications as to the mechanical and electrical construction of the valve.

FIG. 6 shows a valve construction similar to FIG. 5, but in FIG. 6 the two solenoids, designated 20a and 20b, within the housing parts designated 152 and 154, respectively, are separately controlled by the control logic. In such event a printed circuit board, designated 156, may be located in the housing part 152 to provide a mounting for the transistor 26 and the diode 28 shown in FIG. 2, this board being connected by the B+ line and conductor 32 to the control logic through a connector 158. The solenoid 20b within housing part 154 is controlled by components (not shown) on a printed circuit board 160 in exactly the same manner as the solenoid 20a within the housing 152. Again there are two lines including the B+ line extended to a connector, designated 162, for the board 160. The other line, which corresponds to conductor 32, is designated as conductor 164.

The mechanical construction and operation of the valves described above may take any of several forms and be entirely conventional but for the circuit components described above. In general the solenoids can be used to control pilot valves or valve stems or to trigger the operation of the valve by air or other fluid. Because of the packaging of the electrical components as discussed above, extremely low power operation can be used to control numerous valves in a machine. The valves are ideally suited for integrated circuit logic control since the current required to control the operation of the selector and the enabling or switching circuits need be no more than a few milliamps and since the effects of noise and production of noise are minimal.

Although the preferred embodiments of this invention have been described, it will be understood that within the purview of this invention various changes may be made within the scope of the appended claims.

Having thus described my invention, I claim:

1. In a solenoid operated fluid valve for use in production machines and the like, said valve being of the type having a valve housing, a solenoid located at and fixed to said housing for controlling the operation of the valve, the improvement wherein electrical switching means operatively associated with said solenoid is fixed in relation to and located at said housing, said switching means including active means responsive to logic pulses, and external circuit connection means are provided at said housing for electrical connection of a remote solenoid operating voltage source to said solenoid and for separate electrical connection of remote control logic to said switching means.

2. The valve of claim 1 wherein said active means comprises a three element active device having terminal electrodes electrically connected in series with said solenoid, said source and a source return, and a control electrode electrically connected to said circuit connection means.

3. The valve of claim 2 wherein said device is a transistor.

4. The valve of claim 2 wherein said source return is to ground through said housing.

5. The valve of claim 2 wherein said active device is a triac.

6. In a solenoid operated fluid valve for use in production machines and the like, said valve being of the type having a valve housing, first and second solenoids located at and fixed to said housing for controlling the operation of the valve,
the improvement wherein electrical switching means and electrical selector means operatively associated with said solenoid are fixed in relation to and located at said housing, said electrical selector means selecting which of said solenoids will be energized when said switching means enables operation of said solenoids, both said electrical selector means and said switching means including means responsive to logic pulses, and external circuit connection means are provided at said housing for electrical connection of a remote solenoid operating voltage source to said solenoid and for separate electrical connection of remote control logic to said switching means and said selector means.

7. The valve of claim 6 wherein said selector means comprises:
a first three element active device having terminal electrodes electrically connected in series with said first solenoid, said source and a source return, and a control electrode electrically connected to said circuit connection means;
a second three element active device having terminal electrodes electrically connected in series with said second solenoid, said source and a source return, and a control electrode electrically connected to said circuit connection means;
and an inverter electrically connected between said control electrode of said first device and said control electrode of said second device.

8. The valve of claim 7 wherein said switching means comprises a third active device having a terminal electrode electrically connected to one of the terminals of both said first and second devices.

9. The valve of claim 7 wherein said inverter has two terminals; and wherein a first logic gate is provided at said housing having a first input electrically connected to said switching means, a second input electrically connected to one of said terminals of said inverter, and an output electrically connected to said control electrode of said first device; and a second logic gate is provided at said housing having a first input electrically connected to said switching means, a second input electrically connected to the other of said terminals of said inverter, and an output electrically connected to said control electrode of said second device.

10. The valve of claim 1 wherein electrical suppression means operatively associated with said solenoid is fixed in relation to and located at said housing.

11. The valve of claim 6 wherein electrical suppression means operatively associated with said solenoid is fixed in relation to and located at said housing.

12. The valve of claim 6 wherein said selector means includes a first device having at least one control terminal, a second device having at least one control terminal, and an inverter means connected between said control terminal of said first device and said conrol terminal of said second device for controllably applying opposite logic signals to said control terminals.

13. The valve of claim 12 wherein said first device and said second device each have a second terminal and wherein said switching means is connected to said second terminals for controllably generating logic signals at said second terminals.

14. The valve of claim 13 wherein said first device is a three element active device, said second device is a three element active device, and wherein said switching means comprises a third active device having one terminal commonly connected to said second terminals of said first device and said second device.

15. The valve of claim 13 wherein said first device comprises a first logic gate, said first mentioned control terminal comprises a first input of said first logic gate electrically connected to said inverter means, said second device comprises a second logic gate, and said second mentioned control terminal comprises a first input of said second logic gate electrically connected to said inverter means.

* * * * *